US012658219B2

(12) United States Patent　　　　　(10) Patent No.: US 12,658,219 B2

Guo et al.　　　　　　　　　　　　　(45) Date of Patent: Jun. 16, 2026

---

(54) MEMORY, MEMORY USE METHOD, MEMORY MANUFACTURING METHOD, AND ELECTRONIC DEVICE

(71) Applicant: Huawei Technologies Co., Ltd., Shenzhen (CN)

(72) Inventors: Jincan Guo, Shenzhen (CN); Tianqiang Huang, Dongguan (CN); Rongbin Liu, Shenzhen (CN); Jieqiang Chen, Shenzhen (CN); Yun Liu, Shenzhen (CN); Zhengbo Wang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 210 days.

(21) Appl. No.: 18/741,084

(22) Filed: Jun. 12, 2024

(65) Prior Publication Data

US 2024/0331739 A1　　Oct. 3, 2024

Related U.S. Application Data

(63) Continuation of application No. PCT/CN2021/138052, filed on Dec. 14, 2021.

(51) Int. Cl.
G11C 5/06　　　(2006.01)
G11C 7/10　　　(2006.01)

(52) U.S. Cl.
CPC ............ G11C 5/063 (2013.01); G11C 7/1048 (2013.01)

(58) Field of Classification Search
CPC ..... G11C 5/063; G11C 7/1048; G11C 29/783; G11C 29/76; G11C 5/06; G06F 11/1666; G06F 11/2017; H10B 12/01

USPC .......................................................... 365/63
See application file for complete search history.

(56) References Cited

U.S. PATENT DOCUMENTS

| | | |
|---|---|---|
| 2013/0044554 A1 | 2/2013 | Goel et al. |
| 2020/0335143 A1 | 10/2020 | Ajima et al. |
| 2021/0313004 A1 | 10/2021 | Goto |
| 2023/0187413 A1* | 6/2023 | Yoshihara ............. H10W 90/00 257/777 |

FOREIGN PATENT DOCUMENTS

CN　　　105589506 A　　5/2016

OTHER PUBLICATIONS

Shinji Sugatani et al., "Vertically Replaceable Memory Block Architecture for Stacked DRAM Systems by Wafer-on-Wafer (WOW) Technology", IEEE Transactions on Electron Devices, vol. 67, No. 11, Nov. 2020, total 5 pages.

* cited by examiner

*Primary Examiner* — Huan Hoang
(74) *Attorney, Agent, or Firm* — Conley Rose, P.C.

(57) ABSTRACT

A memory includes a control layer and at least one storage layer stacked on the control layer. The storage layer includes a plurality of storage channels, and each storage channel includes an independent data interface bus. The control layer includes a plurality of controllers and a plurality of user interfaces, the controller is configured to access data stored in a storage channel coupled to the controller. The controllers are coupled to the data interface buses of the storage channels in one-to-one correspondence. A quantity of user interfaces is the same as a quantity of user storage channels that can be invoked by a user. The quantity of user interfaces is less than a quantity of controllers.

20 Claims, 5 Drawing Sheets

MEMORY, MEMORY USE METHOD, MEMORY MANUFACTURING METHOD, AND ELECTRONIC DEVICE

CROSS-REFERENCE TO RELATED DISCLOSURES

This is a continuation of International Patent Application No. PCT/CN2021/138052 filed on Dec. 14, 2021, which is hereby incorporated by reference in its entirety.

TECHNICAL FIELD

This disclosure relates to the field of information technologies, and in particular, to a memory, a memory use method, a memory manufacturing method, and an electronic device.

BACKGROUND

Many electronic products use a dynamic random-access memory (DRAM) as a system main memory.

A wafer is a silicon wafer used to manufacture a silicon semiconductor integrated circuit. A die is a chip that is cut from the wafer and has a complete function. A size of the die is generally about several millimeters. There is a solder pad or a hole for connecting to a metal wire (wire bonding) on an edge of the die, and the metal wire is connected to an external pin or a solder pad on a circuit board. DRAM dies are produced based on wafers. One wafer can be used to manufacture a plurality of DRAM dies. After each DRAM die is tested, complete and stable DRAM dies with sufficient capacities are packaged to form a DRAM.

Due to existence of a fail point during DRAM manufacturing, a product yield is low and product costs are increased.

SUMMARY

This disclosure provides a memory, a memory use method, a memory manufacturing method, and an electronic device, to reduce product costs and improve a product yield.

According to a first aspect, this disclosure provides a memory. The memory may include a control layer and a storage layer stacked on the control layer. There may be one storage layer or at least two storage layers. Each storage layer may include a plurality of storage channels. Each storage channel includes a data interface bus. The data interface buses of the plurality of storage channels are independent of each other. Data stored in the storage channel may be read through the data interface bus. Each storage channel may include a plurality of banks. Each bank is generally a two-dimensional (2D) storage array. Rows are horizontal and columns are vertical. Each bank includes some redundant rows and columns for repairing a faulty point to improve a product yield. The control layer may include a plurality of controllers and a plurality of user interfaces. The controller is configured to access data stored in a storage channel connected to the controller. The plurality of controllers is generally connected to the data interface buses of the plurality of storage channels in one-to-one correspondence. In other words, one controller may access data stored in one storage channel connected to the controller.

In an embodiment, each storage channel in each storage layer may be connected to a corresponding controller by using a vertical interconnection structure, so that the control layer can access any storage channel in the storage layer. The vertical interconnection structure may be a through silicon via (TSV) or the like. In this disclosure, a storage channel that can be invoked by a user is referred to as a user storage channel, and a quantity of user interfaces is the same as a quantity of user storage channels that can be invoked by the user. In other words, one user interface corresponds to one user storage channel that can be invoked by the user. The quantity of user interfaces is less than a quantity of controllers. In other words, the quantity of user storage channels that can be invoked by the user is less than a total quantity of storage channels actually included in the memory. Therefore, each user interface may be connected to at least two controllers. In other words, one user interface may be used to access data stored in storage channels connected to the at least two controllers connected to the user interface. This ensures that the user can still normally use the user storage channels after a fault occurs in some of the storage channels, to improve a product yield of the memory and reduce production costs.

In a possible implementation of this disclosure, among all the storage channels, storage channels other than those corresponding to the user storage channels may be used as redundant storage channels. It is assumed that the quantity of controllers is M, that is, the total quantity of storage channels is M, and the quantity of user interfaces is N, that is, the quantity of user storage channels for the user to access is N. In this case, a quantity of redundant storage channels in the memory is R=M−N. In other words, the memory can support a function of selecting any N storage channels from the M storage channels as the user storage channels for the user to access. When a quantity of faulty storage channels in the memory is less than or equal to the quantity of redundant storage channels, it can be ensured that the user can normally use all the user storage channels. A redundant storage channel is provided in the memory to provide a repair resource to effectively improve the product yield of the memory.

In a possible implementation of this disclosure, a redundant storage channel may be added to at least one storage layer of all storage layers. For ease of manufacturing, generally, quantities of storage channels in all of the storage layers are the same. Therefore, a same quantity of redundant storage channels may be added to each storage layer. For example, the memory includes two storage layers in total, and 32 user storage channels are provided for the user to use. Two redundant storage channels may be added to each storage layer that originally includes 16 storage channels. In other words, each storage layer includes 18 storage channels, and the memory includes 36 storage channels in total. Four of the 36 storage channels are redundant storage channels. In this case, a 32-of-36 selection function is supported in the memory. In other words, any 32 user storage channels can be selected from the 36 storage channels for the user to use.

For another example, the memory includes four storage layers in total, and 64 user storage channels are provided for the user to use. Two redundant storage channels may be added to each storage layer that originally includes 16 storage channels. In other words, each storage layer includes 18 storage channels, and the memory includes 72 storage channels in total. Eight storage channels of the 72 storage channels are redundant storage channels. In this case, a 64-of-72 selection function is supported in the memory. In other words, any 64 user storage channels can be selected from the 72 storage channels for the user to use. After the redundant storage channels are added to each storage layer in the memory in the foregoing manner, when a quantity of available storage channels in the 72 storage channels is greater than or equal to 64, that is, a quantity of faulty storage channels in the 72 storage channels is less than 8, it may be considered that the memory is good. To compare the yield of the solution in this disclosure with that of a solution of wafer to wafer stacking, it is assumed that a yield of a wafer is 90%, that is, a probability that there is a good DRAM die on the wafer is 90%, and probabilities that there are a specific quantity of faulty storage channels are equal in bad DRAM dies. In this case, a formula for calculating a product yield X in the solution in this disclosure is as follows, and the product yield X is approximately equal to 78.57%.

$$X \approx 0.9^4 + 4*0.9^3*0.1*\frac{8}{18} = 0.7857$$

According to the original technical solution of wafer to wafer stacking, a product yield of four-layer stacking is 90% to the fourth power, and is only 65.61%. The product yield can be improved by approximately 13% by using the technical solution.

In a possible implementation of this disclosure, one or more redundant storage layers may be stacked after an original storage layer is stacked on the control layer. In other words, all storage channels in the redundant storage layers are used as redundant storage channels. In this embodiment, a structure of the memory is a memory product in which a control layer, a storage layer, and a redundant storage layer are stacked together. It is assumed that a quantity of storage layers is P, a quantity of storage channels included in each storage layer is Q, and a quantity of controllers is M, a quantity of user interfaces is N, where P, Q, M, and N are all integers greater than 1. A total quantity P*Q of storage channels is equal to the quantity M of controllers. If one redundant storage layer is added, a quantity M-N of redundant storage channels is equal to a quantity Q of storage channels included in the redundant storage layer. For example, if the memory provides 32 user storage channels for the user to use, in other technologies, two storage layers each of which 16 storage channels are stacked on the control layer to meet a requirement. According to the solution provided in this embodiment, one more redundant storage layer including 16 storage channels may be stacked. In this way, the extra 16 redundant storage channels may be used as repair resources, to improve the product yield.

In a possible implementation of this disclosure, when a redundant storage channel is added to each storage layer, one or more redundant storage layers may be stacked after an original storage layer is stacked on the control layer. In other words, all storage channels in the redundant storage layers are used as redundant storage channels. In this embodiment, a structure of the memory is a memory product in which a control layer, a storage layer including a redundant storage channel, and a redundant storage layer are stacked together. It is assumed that a quantity of storage layers is P, a quantity of storage channels included in each storage layer is Q, a quantity of controllers is M, and a quantity of user interfaces is N, where P, Q, M, and N are all integers greater than 1. A total quantity P*Q of storage channels is equal to the quantity M of controllers. If one redundant storage layer is added, a quantity M-N of redundant storage channels is greater than the quantity Q of storage channels included in the storage layer (where it should be noted that Q mentioned herein is a quantity of all storage channels included in one storage layer, in other words, the Q storage channels also include the redundant storage channels). For example, if the memory provides 32 user storage channels for the user to use, in other technologies, two storage layers each of which 16 storage channels are stacked on the control layer to meet a requirement. According to the solution provided in this embodiment, two redundant storage channels may be added to each storage layer. In other words, each storage layer includes 18 storage channels in total. One more redundant storage layer including 18 storage channels is stacked. In this way, the extra 22 redundant storage channels may be used as repair resources, to improve the product yield.

In conclusion, in this embodiment of this disclosure, the memory supports stacking of a redundant storage layer to increase a quantity of storage layers, or a storage capacity of the storage layer is increased, in other words, a quantity of storage channels in each storage layer is increased, so that the memory includes a redundant storage channel to provide a repair resource. In addition, the control layer supports controlling the redundant storage channel to replace a faulty storage channel, so that when a quantity of faulty storage channels is less than or equal to a quantity of redundant storage channels, the user can normally use all user storage channels.

In a possible implementation of this disclosure, to enable the control layer to support controlling a redundant storage channel to replace a faulty storage channel, each user interface in the control layer is connected to at least two controllers. In other words, one user interface can be used to access at least two storage channels. In addition, probabilities that there are a specific quantity of faulty storage channels are equal in storage layers. Therefore, each user interface may be designed to be connected to a same quantity of controllers. In addition, to make full use of the redundant storage channel, each user interface may be connected to controllers whose quantity is greater than a quantity of redundant channels by 1. In an embodiment, when the quantity of controllers is M, the quantity of user interfaces is N, and the quantity of redundant storage channels is M−N, one user interface may be connected to M−N+1 controllers. Both M and N are integers greater than 1, and M>N. For example, if M is 12 and N is 10, each user interface may be connected to three controllers.

In a possible implementation of this disclosure, an $i^{th}$ user interface in the N user interfaces may be further connected to $i^{th}$ to $(i+M-N)^{th}$ controllers in the M controllers. In this way, a user storage channel numbered i on a user side may choose to send a read/write request to a specific storage channel in storage channels numbered i to i+M−N and choose to receive read data returned by the specific storage channel in the storage channels numbered i to i+M−N. In addition, each user interface is used to finally access data in a storage channel connected to one of the at least two controllers connected to the user interface. Storage channels accessed by using the user interfaces are different from each other. Selection circuits in two directions are used to implement one-to-one mapping between N user storage channels and N storage channels selected from M storage channels, so that the memory supports a function of selecting any N storage channels from the M storage channels for the user to access.

In a possible implementation of this disclosure, when M is 12 and N is 10, a user interface numbered 1 is connected to controllers numbered 1 to 3, a user interface numbered 2 is connected to controllers numbered 2 to 4, and so on. When it is determined that the $2^{nd}$ storage channel and the $5^{th}$ storage channel are faulty, the user interface numbered 1 is used to access data in a storage channel connected to the controller numbered 1, the user interface numbered 2 is used to access data in a storage channel connected to the controller numbered 3, a user interface numbered 3 is used to access data in a storage channel connected to the controller numbered 4, a user interface numbered 4 is used to access data in a storage channel connected to a controller numbered 6, a user interface numbered 5 is used to access data in a storage channel connected to a controller numbered 7, . . . , and a user interface numbered 10 is used to access data in a storage channel connected to a controller numbered 12.

According to a second aspect, a technical solution of this disclosure further provides an electronic device. The electronic device includes the memory in any one of the foregoing technical solutions.

According to a third aspect, a technical solution of this disclosure further provides a memory use method. A memory includes a control layer and a storage layer stacked on the control layer. The storage layer includes a plurality of storage channels, and each storage channel includes a data interface bus. The control layer includes a plurality of controllers and a plurality of user interfaces. The plurality of controllers is connected to the data interface buses of the plurality of storage channels in one-to-one correspondence. A quantity of controllers is greater than a quantity of user interfaces. One user interface is connected to at least two controllers. The use method includes accessing, by using the user interface, data in a storage channel connected to one of the at least two controllers connected to the user interface. Storage channels accessed by using the user interfaces are different. This ensures that a user can still normally use the user storage channels after a fault occurs in some of the storage channels, to improve a product yield of the memory and reduce production costs.

In a possible implementation of this disclosure, in a process of using the memory or a process of testing the memory, after it is found that several storage channels (including one or more storage channels) in the memory are damaged, the damaged storage channels may be marked as faulty storage channels. When a quantity of faulty storage channels marked in the memory is less than or equal to a quantity of redundant storage channels, repair resources may be provided by the redundant storage channels. Data in a storage channel that is not marked as a faulty storage channel and that is connected to one of the at least two controllers connected to the user interface is accessed by using the user interface in the memory, to ensure that the user can access a storage channel that works normally.

According to a fourth aspect, a technical solution of this disclosure further provides a memory manufacturing method. The method includes forming a control layer including a plurality of controllers and a plurality of user interfaces, where a quantity of controllers is greater than a quantity of user interfaces, and one user interface is connected to at least two controllers, and stacking a storage layer including a plurality of storage channels on the control layer, where each storage channel includes a data interface bus, the data interface buses of the plurality of storage channels are independent of each other, where the plurality of controllers are connected to the data interface buses of the plurality of storage channels in one-to-one correspondence.

In a possible implementation of this disclosure, a vertical interconnection structure may be formed between a first controller and a data interface bus that is correspondingly connected to the first controller. The first controller is any one of the plurality of controllers. In this way, the control layer can access any storage channel in the storage layer. The vertical interconnection structure may be a TSV or the like.

In a possible implementation of this disclosure, at least two storage layers may be stacked on the control layer. For ease of manufacturing, generally, quantities of storage channels in all of the storage layers may be the same.

In a possible implementation of this disclosure, probabilities that there are a specific quantity of faulty storage channels are equal in storage layers. Therefore, each user interface may be designed to be connected to a same quantity of controllers. In addition, to make full use of a redundant storage channel, each user interface may be connected to controllers whose quantity is greater than a quantity of redundant channels by 1. In an embodiment, when the quantity of controllers is M, the quantity of user interfaces is N, and the quantity of redundant storage channels is M–N, one user interface may be connected to M–N+1 controllers. Both M and N are integers greater than 1, and M>N. For example, if M is 12 and N is 10, each user interface may be connected to three controllers.

In a possible implementation of this disclosure, an $i^{th}$ user interface in the N user interfaces may be further connected to $i^{th}$ to $(i+M–N)^{th}$ controllers in the M controllers. In this way, a user storage channel numbered i on a user side may choose to send a read/write request to a specific storage channel in storage channels numbered i to i+M–N and choose to receive read data returned by the specific storage channel in the storage channels numbered i to i+M–N. In addition, each user interface is used to finally access data in a storage channel connected to one of the at least two controllers connected to the user interface. Storage channels accessed by using the user interfaces are different from each other. Selection circuits in two directions are used to implement one-to-one mapping between N user storage channels and N storage channels selected from M storage channels, so that the memory supports a function of selecting any N storage channels from the M storage channels for the user to access.

DESCRIPTION OF EMBODIMENTS

Figure 1:
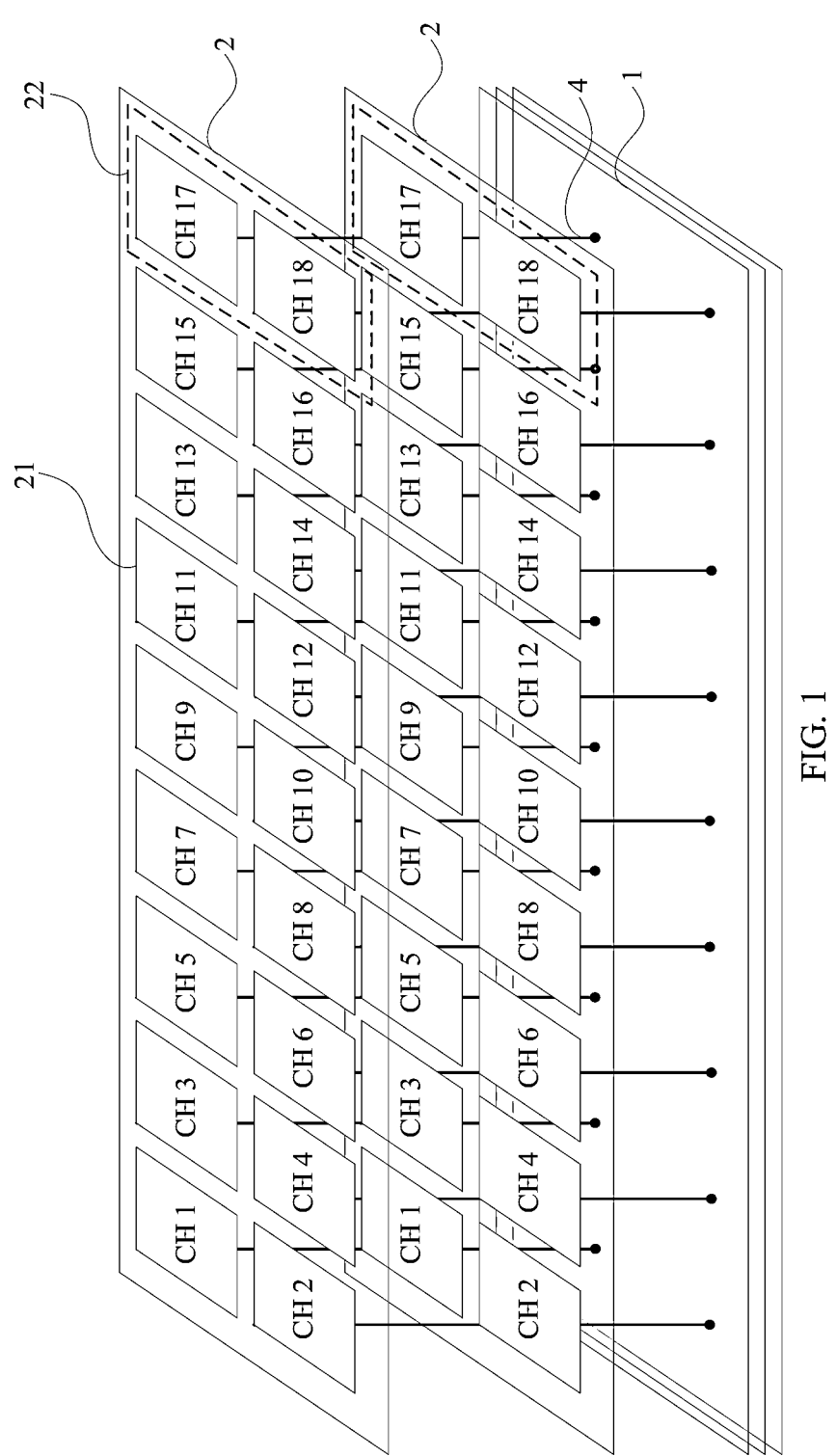
FIG. 1 is a schematic of a three-dimensional (3D) structure of a memory according to an embodiment of this disclosure.

To make the objectives, technical solutions, and advantages of this disclosure clearer, the following further describes this disclosure in detail with reference to the accompanying drawings.

Terms used in the following embodiments are merely intended to describe specific embodiments, but are not intended to limit this disclosure. As used in the specification and the appended claims of this disclosure, the singular expressions "a/an", "one", "said", "the above", "the", and "this" are intended to include such expressions as "one or more", unless otherwise clearly indicated in the context.

Reference to "an embodiment", "some embodiments", or the like described in this specification indicates that one or more embodiments of this disclosure include a specific feature, structure, or characteristic described with reference to the embodiments. Therefore, statements such as "in an embodiment", "in some embodiments", "in some other embodiments", and "in other embodiments" that appear in different places in this specification do not necessarily mean referring to a same embodiment. Instead, the statements mean "one or more but not all of embodiments", unless otherwise emphasized in another manner. The terms "include", "comprises", "have", and their variants all mean "include, but are not limited to", unless otherwise emphasized in another manner.

A memory provided in embodiments of this disclosure may be used in an electronic device. The electronic device may be a computer system, for example, a server, a desktop computer, or a notebook computer. The memory in embodiments of this disclosure may be further used in a last cache of the computer system close to a central processing unit (CPU). In addition, the electronic device may be a mobile terminal product, for example, a mobile phone. A type of the electronic device is not limited in this disclosure. The memory in this disclosure may be a DRAM. The memory in this disclosure may be further used for data storage, and may be used to write and read data.

The DRAM includes a plurality of banks. Each bank is a 2D storage array. Rows are horizontal and columns are vertical. During production of the DRAM, some invalid addresses may occur, and are also referred to as faulty points. To improve a product yield, each bank of the DRAM may include some redundant rows and columns for repairing the faulty points.

With development of technologies, a system of an electronic product may have a larger DRAM storage capacity and bandwidth. To meet the requirement, a plurality of layers is stacked in the DRAM for use. Such a stacked DRAM product is referred to as a 3D DRAM. In the 3D DRAM, each storage layer (DRAM die) is divided into a plurality of storage channels. One channel includes a plurality of banks. Each channel includes an independent data interface bus for executing a command. In this disclosure, a DRAM channel that can be invoked by a user is referred to as a user storage channel (or user channel).

During 3D DRAM manufacturing, a plurality of DRAM dies is first manufactured on each wafer, and then a plurality of layers is stacked in the DRAM before packaging. There are two stacking technologies: a wafer to wafer stacking technology and a die to wafer stacking technology.

If the multi-layer DRAM uses the wafer to wafer stacking technology, several produced DRAM wafers are stacked and then cut. A single DRAM die in each layer of wafer is repaired by using redundant resources in the die. In an embodiment, DRAM dies in each layer of DRAM wafer are independently repaired by using redundant row and column resources in the dies, and then a plurality of layers of wafers are stacked and then cut to obtain stacked DRAM dies. After stacking, for each layer of DRAM dies, remaining available redundant row and column resources in the dies may be used to repair a faulty point that occurs in a stacking process. During wafer stacking, cases in which redundant resources can be used to repair all faulty points (good DRAM die) and redundant resources cannot be used to repair all faulty points (bad DRAM die) may be stacked. During wafer to wafer stacking, a good DRAM die and a bad DRAM die are very easily stacked together. Consequently, a 3D DRAM obtained through stacking cannot be used normally. A product yield of an n-layer stacked 3D DRAM is equal to a product yield of a single-layer DRAM to an $n^{th}$ power. Therefore, a product yield in the wafer to wafer stacking is low and product costs are high.

If the multi-layer DRAM uses die to wafer stacking, a single DRAM die in each layer of wafer is first repaired and filtered by using redundant resources in the die, and then good DRAM dies are selected for stacking. After stacking, for each layer of DRAM dies, remaining available redundant row and column resources in the dies may be used to repair a faulty point that occurs in a stacking process. During die to wafer stacking, good DRAM dies are selected first. Production costs are higher than those of the wafer to wafer stacking. In addition, in a process of stacking the good DRAM dies, a new faulty point may occur. If a quantity of faulty points is greater than a repairable range of redundant row and column resources in the stacked DRAM dies, the stacked DRAM dies are also discarded. In other words, if there are still several faulty points in a DRAM die that is repaired using the redundant resources, the DRAM die is discarded, and product costs are also high.

Figure 2:
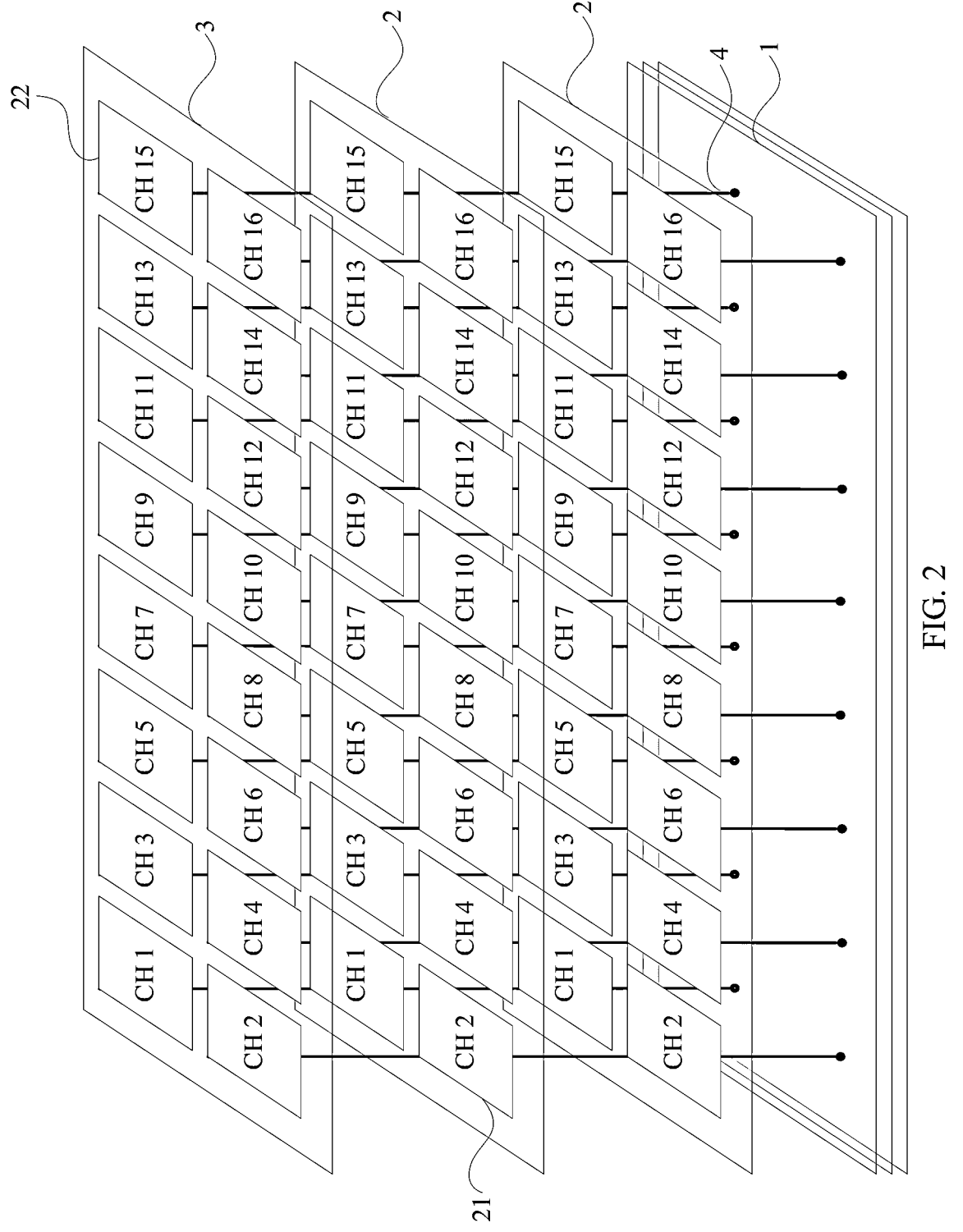
FIG. 2 is a schematic of another 3D structure of a memory according to an embodiment of this disclosure.
Figure 3:
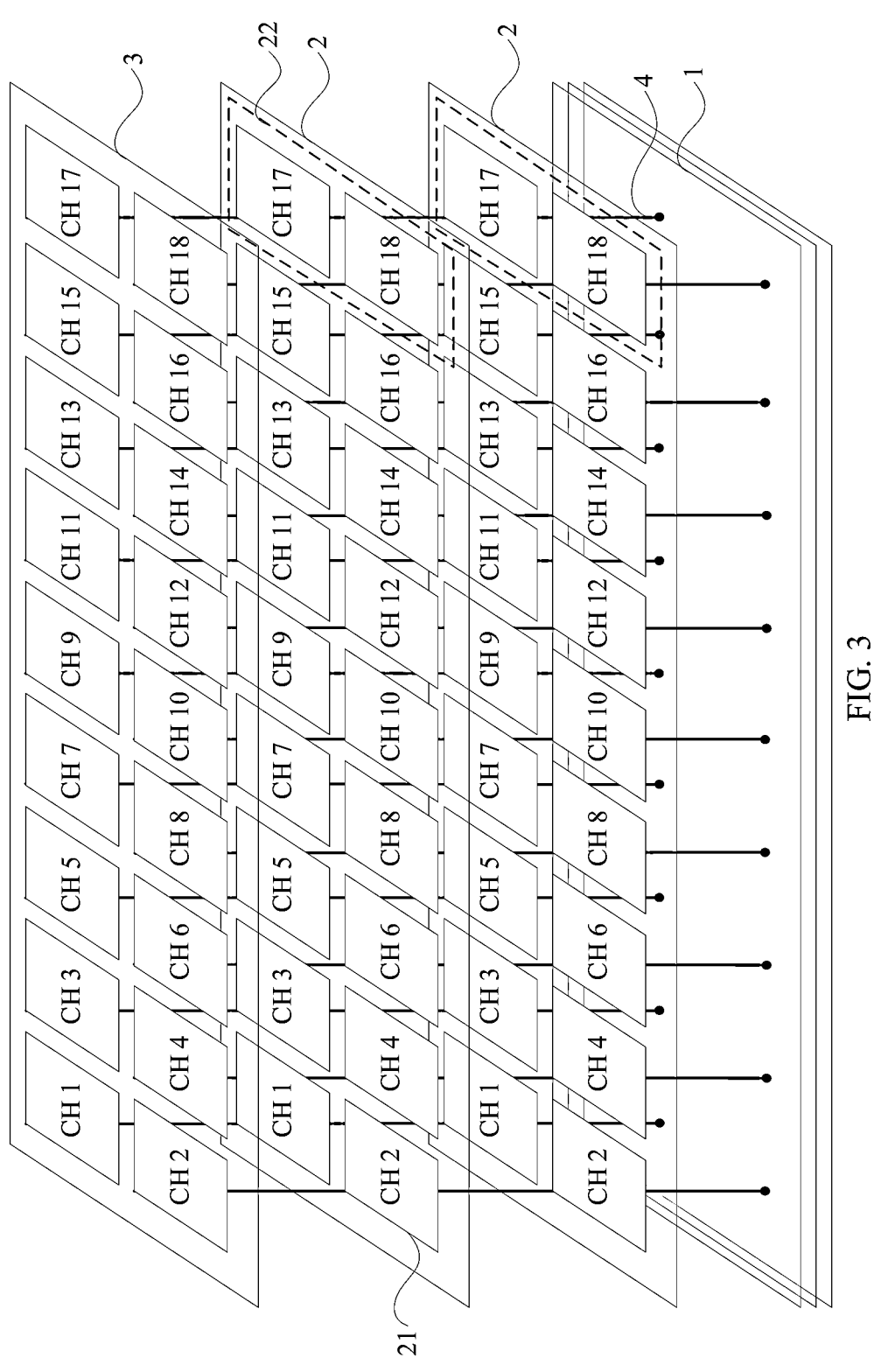
FIG. 3 is a schematic of another 3D structure of a memory according to an embodiment of this disclosure.
Figure 4:
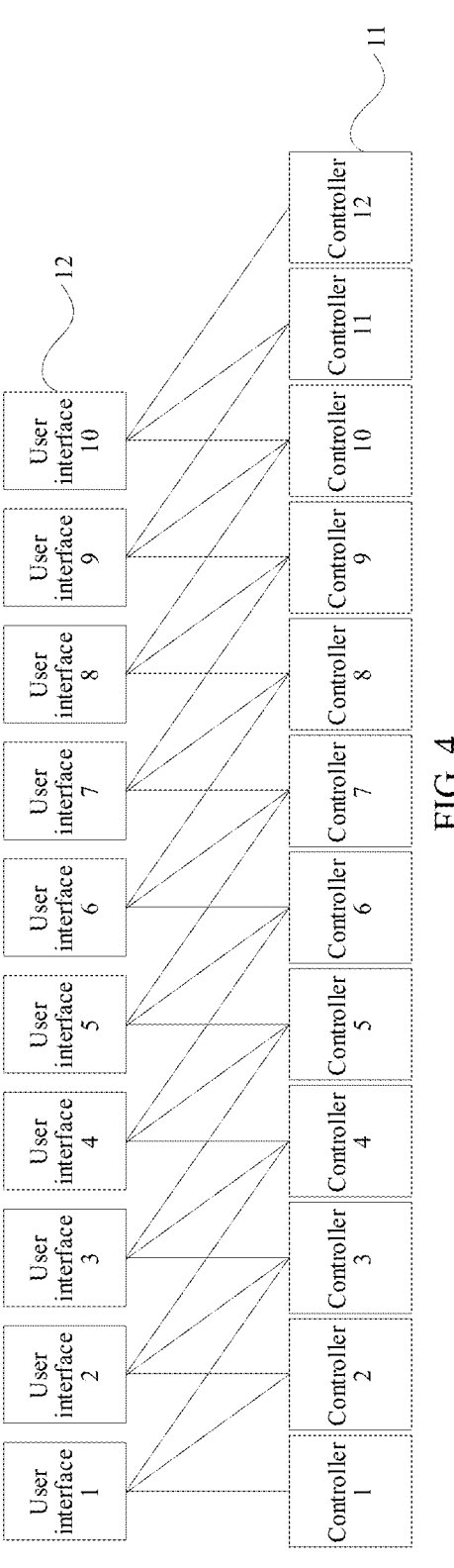
FIG. 4 is a schematic of a structure of a control layer in a memory according to an embodiment of this disclosure.

FIG. 1 is a schematic of an example of a 3D structure of a memory according to an embodiment of this disclosure. FIG. 2 is a schematic of an example of a 3D structure of another memory according to an embodiment of this disclosure. FIG. 3 is a schematic of an example of a 3D structure of another memory according to an embodiment of this disclosure. FIG. 4 is a schematic of an example of a structure of a control layer in a memory according to an embodiment of this disclosure.

Refer to FIG. 1 to FIG. 3. In embodiments of this disclosure, the memory may include a control layer 1 (logic base die) and a storage layer 2 (DRAM die) stacked on the control layer 1. There may be one storage layer 2 or at least two storage layers 2. Refer to FIG. 1. For example, two storage layers 2 may be stacked. Refer to FIG. 2 and FIG. 3. Three storage layers 2 and 3 may be stacked. Each storage layer 2 may include a plurality of storage channels 21. Each storage channel 21 includes a data interface bus. The data interface buses of the plurality of storage channels 21 are independent of each other. Data stored in the storage channel 21 may be read through the data interface bus. Each storage channel 21 may include a plurality of banks. Each bank is generally a 2D storage array. Rows are horizontal and columns are vertical. Each bank includes some redundant rows and columns for repairing a faulty point to improve a product yield. Refer to FIG. 4. The control layer 1 may include a plurality of controllers 11 and a plurality of user interfaces 12. The controller 11 is configured to access data stored in a storage channel 21 connected to the controller 11. The plurality of controllers 11 are generally connected to the data interface buses of the plurality of storage channels 21 in one-to-one correspondence. In other words, one controller 11 may access data stored in one storage channel 21 connected to the controller 11. Refer to FIG. 1. In an embodiment, each storage channel 21 in each storage layer 2 may be connected to a corresponding controller 11 by using a vertical interconnection structure 4, so that the control layer 1 can access any storage channel in the storage layer 2. The vertical interconnection structure 4 may be a TSV or the like. A quantity of user interfaces 12 is the same as a quantity of user storage channels that can be invoked by a user. In other words, one user interface 12 corresponds to one user storage channel that can be invoked by the user. The quantity of user interfaces 12 is less than a quantity of controllers 11. In other words, the quantity of user storage channels that can be invoked by the user is less than a total quantity of storage channels 21 actually included in the memory. Therefore, each user interface 12 may be connected to at least two controllers 11. In other words, one user interface 12 may be used to access data stored in storage channels 21 connected to the at least two controllers 11 connected to the user interface 12. This ensures that the user can still normally use the user storage channels after a fault occurs in some of the storage channels 21, to improve a product yield of the memory and reduce production costs.

In this embodiment of this disclosure, a part in which the total quantity of storage channels 21 in the memory is greater than the quantity of user storage channels may be used as a redundant storage channel. It is assumed that the quantity of controllers 11 is M, that is, the total quantity of storage channels 21 is M, and the quantity of user interfaces 12 is N, that is, the quantity of user storage channels for the user to access is N. In this case, a quantity of redundant storage channels in the memory is R=M−N. In other words, the memory can support a function of selecting any N storage channels from the M storage channels 21 as the user storage channels for the user to access. When a quantity of faulty storage channels 21 in the memory is less than or equal to the quantity of redundant storage channels, it can be ensured that the user can normally use all the user storage channels. A redundant storage channel is provided in the memory to provide a repair resource to effectively improve the product yield of the memory.

Refer to FIG. 1. In this embodiment of this disclosure, a redundant storage channel 22 may be added to at least one storage layer 2 of all storage layers 2. For ease of manufacturing, generally, quantities of storage channels 21 in all of the storage layers 2 are the same. Therefore, a same quantity of redundant storage channels 22 may be added to the storage layers 2. For example, the memory includes two storage layers 2 in total, and 32 user storage channels are provided for the user to use. Two redundant storage channels 22 may be added to each storage layer 2 that originally includes 16 storage channels. In other words, each storage layer 2 includes 18 storage channels 21, and the memory includes 36 storage channels 21 in total. Four of the 36 storage channels 21 are redundant storage channels 22. In this case, a 32-of-36 selection function is supported in the memory. In other words, any 32 user storage channels can be selected from the 36 storage channels for the user to use.

For another example, the memory includes four storage layers 2 in total, and 64 user storage channels are provided for the user to use. Two redundant storage channels 22 may be added to each storage layer 2 that originally includes 16 storage channels. In other words, each storage layer 2 includes 18 storage channels 21, and the memory includes 72 storage channels 21 in total. Eight storage channels 21 of the 72 storage channels 21 are redundant storage channels 22. In this case, a 64-of-72 selection function is supported in the memory. In other words, any 64 user storage channels can be selected from the 72 storage channels for the user to use. After the redundant storage channels are added to each storage layer in the memory in the foregoing manner, when a quantity of available storage channels in the 72 storage channels is greater than or equal to 64, that is, a quantity of faulty storage channels in the 72 storage channels is less than 8, it may be considered that the memory is good. To compare the yield of the solution in this disclosure with that of a solution of wafer to wafer stacking, it is assumed that a yield of a wafer is 90%, that is, a probability that there is a good DRAM die on the wafer is 90%, and probabilities that there are a specific quantity of faulty storage channels are equal in bad DRAM dies. In this case, a formula for calculating a product yield X in the solution in this disclosure is as follows, and the product yield X is approximately equal to 78.57%.

$$X \approx 0.9^4 + 4*0.9^3*0.1*\frac{8}{18} = 0.7857$$

According to the original technical solution of wafer to wafer stacking, a product yield of four-layer stacking is 90% to the fourth power, and is only 65.61%. The product yield can be improved by approximately 13% by using the technical solution.

Refer to FIG. 2. In this embodiment of this disclosure, one or more redundant storage layers 3 may be stacked after an original storage layer 2 is stacked on the control layer 1. In other words, all storage channels in the redundant storage layers 3 are used as redundant storage channels 22. In this embodiment, a structure of the memory is a memory product in which a control layer 1, a storage layer 2, and a redundant storage layer 3 are stacked together. It is assumed that a quantity of storage layers 2 is P, a quantity of storage channels 21 included in each storage layer 2 is Q, a quantity of controllers 11 is M, and a quantity of user interfaces 12 is N, where P, Q, M, and N are all integers greater than 1. A total quantity P*Q of storage channels 21 is equal to the quantity M of controllers 11. If one redundant storage layer 3 is added, a quantity M−N of redundant storage channels 22 is equal to a quantity Q of storage channels included in the redundant storage layer 3. For example, if the memory provides 32 user storage channels for the user to use, in other technologies, two storage layers 2 each of which 16 storage channels 21 are stacked on the control layer 1 to meet a requirement. According to the solution provided in this embodiment, one more redundant storage layer 3 including 16 storage channels 21 may be stacked. In this way, the extra 16 redundant storage channels 22 may be used as repair resources, to improve the product yield.

Refer to FIG. 3. In this embodiment of this disclosure, when a redundant storage channel 22 is added to each storage layer 2, one or more redundant storage layers 3 may be stacked after an original storage layer 2 is stacked on the control layer 1. In other words, all storage channels in the redundant storage layers 3 are used as redundant storage channels 22. In embodiment, a structure of the memory is a memory product in which a control layer 1, a storage layer 2 including a redundant storage channel 22, and a redundant storage layer 3 are stacked together. It is assumed that a quantity of storage layers 2 is P, a quantity of storage channels 21 included in each storage layer 2 is Q, a quantity of controllers 11 is M, and a quantity of user interfaces 12 is N, where P, Q, M, and N are all integers greater than 1. A total quantity P*Q of storage channels 21 is equal to the quantity M of controllers 11. If one redundant storage layer 3 is added, a quantity M−N of redundant storage channels is greater than the quantity Q of storage channels included in the storage layer 2 (where it should be noted that Q mentioned herein is a quantity of all storage channels included in the storage layer, in other words, the Q storage layers also include the redundant storage channels). For example, if the memory provides 32 user storage channels for the user to use, in other technologies, two storage layers each of which 16 storage channels are stacked on the control layer 1 to meet a requirement. According to the solution provided in this embodiment, two redundant storage channels may be added to each storage layer 2. In other words, each storage layer 2 includes 18 storage channels in total. One more redundant storage layer 3 including 18 storage channels is stacked. In this way, the extra 22 redundant storage channels may be used as repair resources, to improve the product yield.

In conclusion, in embodiments of this disclosure, the memory supports stacking of a redundant storage layer 3 to increase a quantity of storage layers 2, or a storage capacity of the storage layers 2 is increased, in other words, a quantity of storage channels 21 in each storage layer is increased, so that the memory includes a redundant storage channel to provide a repair resource. In addition, the control layer 1 supports controlling the redundant storage channel 22 to replace a faulty storage channel 21, so that when a quantity of faulty storage channels 21 is less than or equal to a quantity of redundant storage channels 22, the user can normally use all user storage channels.

Refer to FIG. 4. In this embodiment of this disclosure, to enable the control layer 1 to support controlling a redundant storage channel 22 to replace a faulty storage channel 21, each user interface 12 in the control layer 1 is connected to at least two controllers 11. In other words, one user interface 12 can be used to access at least two storage channels 21. In addition, probabilities that there are a specific quantity of faulty storage channels 21 are equal in storage layers 2. Therefore, each user interface 12 may be designed to be connected to a same quantity of controllers 11. In addition, to make full use of the redundant storage channel, each user interface 12 may be connected to controllers whose quantity is greater than a quantity of redundant channels by 1. Further, when the quantity of controllers 11 is M, the quantity of user interfaces 12 is N, and the quantity of redundant storage channels is M–N, one user interface 12 may be connected to M-N+1 controllers 11. Both M and N are integers greater than 1, and M>N. For example, if M is 12 and N is 10, each user interface 12 may be connected to three controllers 11.

Refer to FIG. 4. In this embodiment of this disclosure, an $i^{th}$ user interface 12 in the N user interfaces 12 may be connected to $i^{th}$ to $(i+M–N)^{th}$ controllers 11 in the M controllers 11. In this way, a user storage channel numbered i on a user side may choose to send a read/write request to a specific storage channel in storage channels numbered i to i+M–N and choose to receive read data returned by the specific storage channel in the storage channels numbered i to i+M–N. In addition, each user interface 12 is used to finally access data in a storage channel 21 connected to one of the at least two controllers 11 connected to the user interface 12. Storage channels 22 accessed by using the user interfaces 12 are different from each other. Selection circuits in two directions are used to implement one-to-one mapping between N user storage channels and N storage channels selected from M storage channels, so that the memory supports a function of selecting any N storage channels from the M storage channels for the user to access.

Figure 5:
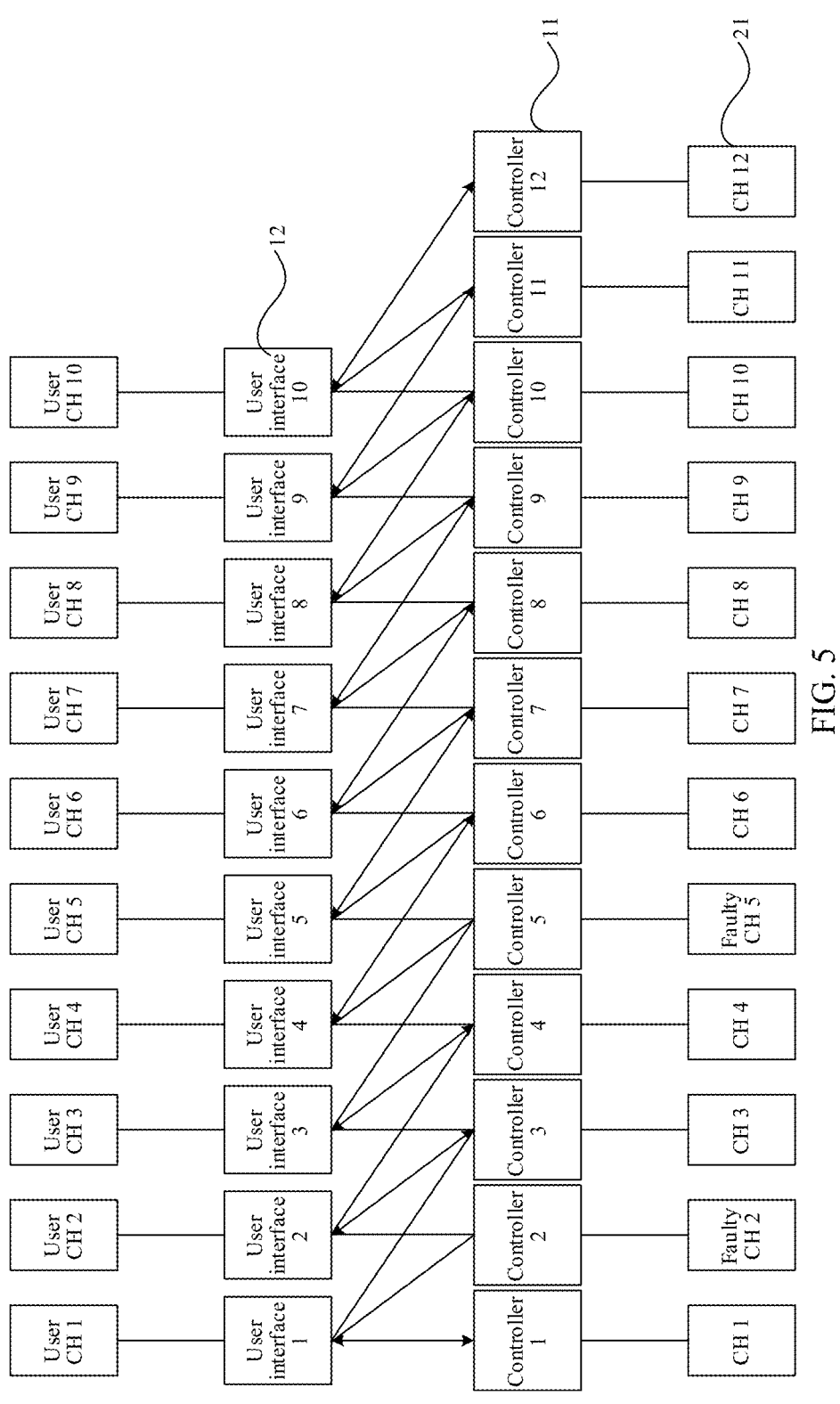
FIG. 5 is a schematic of implementing N-of-M selection in a memory for user access according to an embodiment of this disclosure.

FIG. 5 is a schematic of an example of implementing N-of-M selection in the memory for user access according to an embodiment of this disclosure.

Refer to FIG. 5. For example, when M is 12 and N is 10, a user interface numbered 1 is connected to controllers numbered 1 to 3, a user interface numbered 2 is connected to controllers numbered 2 to 4, and so on. When it is determined that the $2^{nd}$ storage channel 21 and the $5^{th}$ storage channel 21 are faulty, the user interface 12 numbered 1 is used to access data in a storage channel 21 connected to the controller 11 numbered 1, the user interface 12 numbered 2 is used to access data in a storage channel 21 connected to the controller 11 numbered 3, a user interface 12 numbered 3 is used to access data in a storage channel 21 connected to the controller 11 numbered 4, a user interface 12 numbered 4 is used to access data in a storage channel 21 connected to a controller 11 numbered 6, a user interface 12 numbered 5 is used to access data in a storage channel 21 connected to a controller 11 numbered 7, . . . , and a user interface 12 numbered 10 is used to access data in a storage channel 21 connected to a controller 11 numbered 12.

An embodiment of this disclosure further provides a memory use method. A memory includes a control layer and a storage layer stacked on the control layer. The storage layer includes a plurality of storage channels, and each storage channel includes a data interface bus. The control layer includes a plurality of controllers and a plurality of user interfaces. The plurality of controllers is connected to the data interface buses of the plurality of storage channels in one-to-one correspondence. A quantity of controllers is greater than a quantity of user interfaces. One user interface is connected to at least two controllers. The use method includes: accessing, by using the user interface, data in a storage channel connected to one of the at least two controllers connected to the user interface. Storage channels accessed by using the user interfaces are different. This ensures that a user can still normally use the user storage channels after a fault occurs in some of the storage channels, to improve a product yield of the memory and reduce production costs.

In this embodiment of this disclosure, in a process of using the memory or a process of testing the memory, after it is found that several storage channels (including one or more storage channels) in the memory are damaged, the damaged storage channels may be marked as faulty storage channels. When a quantity of faulty storage channels marked in the memory is less than or equal to a quantity of redundant storage channels, repair resources may be provided by the redundant storage channels. Data in a storage channel that is not marked as a faulty storage channel and that is connected to one of the at least two controllers connected to the user interface is accessed by using the user interface in the memory, to ensure that the user can access a storage channel that works normally.

An embodiment of this disclosure further provides a memory manufacturing method. The method includes forming a control layer including a plurality of controllers and a plurality of user interfaces, where a quantity of controllers is greater than a quantity of user interfaces, and one user interface is connected to at least two controllers, and stacking a storage layer including a plurality of storage channels on the control layer, where each storage channel includes a data interface bus, the data interface buses of the plurality of storage channels are independent of each other, where the plurality of controllers are connected to the data interface buses of the plurality of storage channels in one-to-one correspondence.

In this embodiment of this disclosure, a vertical interconnection structure may be formed between a first controller and a data interface bus that is correspondingly connected to the first controller. The first controller is any one of the plurality of controllers. In this way, the control layer can access any storage channel in the storage layer. The vertical interconnection structure may be a TSV or the like.

In this embodiment of this disclosure, at least two storage layers may be stacked on the control layer. For ease of manufacturing, generally, quantities of storage channels in all of the storage layers may be the same.

In this embodiment of this disclosure, probabilities that there are a specific quantity of faulty storage channels are equal in storage layers. Therefore, each user interface may be designed to be connected to a same quantity of controllers. In addition, to make full use of the redundant storage channel, each user interface may be connected to controllers whose quantity is greater than a quantity of redundant channels by 1. In an embodiment, when the quantity of controllers is M, the quantity of user interfaces is N, and the quantity of redundant storage channels is M−N, one user interface may be connected to M−N+1 controllers. Both M and N are integers greater than 1, and M>N. For example, if M is 12 and N is 10, each user interface may be connected to three controllers.

In this embodiment of this disclosure, an $i^{th}$ user interface in the N user interfaces may be connected to $i^{th}$ to $(i+M-N)^{th}$ controllers in the M controllers. In this way, a user storage channel numbered i on a user side may choose to send a read/write request to a specific storage channel in storage channels numbered i to i+M−N and choose to receive read data returned by the specific storage channel in the storage channels numbered i to i+M−N. In addition, each user interface is used to finally access data in a storage channel connected to one of the at least two controllers connected to the user interface. Storage channels accessed by using the user interfaces are different from each other. Selection circuits in two directions are used to implement one-to-one mapping between N user storage channels and N storage channels selected from M storage channels, so that the memory supports a function of selecting any N storage channels from the M storage channels for the user to access.

An embodiment of this disclosure further provides an electronic device. The electronic device may include any memory provided in the foregoing embodiments of this disclosure. A problem-resolving principle of the electronic device is similar to that of the foregoing memory. Therefore, for an implementation of the electronic device, refer to the implementations of the foregoing memory, and a repeated part is not described in detail again.

It is clear that a person skilled in the art can make various modifications and variations to this disclosure without departing from the scope of this disclosure. In this way, this disclosure is intended to cover these modifications and variations of this disclosure provided that they fall within the scope of the claims of this disclosure and their equivalent technologies.

What is claimed is:

1. A memory comprising:
at least one storage layer comprising storage channels that are independent of each other, wherein the storage channels comprise data interface buses; and
a control layer comprising:
controllers coupled to the data interface buses in a one-to-one correspondence; and
user interfaces, wherein a first quantity of the controllers is greater than a second quantity of the user interfaces, and wherein each of the user interfaces is coupled to at least two controllers of the controllers, wherein the at least one storage layer is stacked on the control layer.

2. The memory of claim 1, wherein each of the user interfaces is coupled to a third quantity of the controllers.

3. The memory of claim 2, wherein the first quantity is M, wherein the second quantity is N, wherein the third quantity is M−N+1, wherein both M and N are integers greater than 1, and wherein M>N.

4. The memory of claim 3, wherein an $i^{th}$ user interface in the user interfaces is coupled to $i^{th}$ to $(i+M-N)^{th}$ controllers in the controllers.

5. The memory of claim 1, wherein each of the user interfaces is configured to access data in a different set of storage channels of the storage channels that is coupled to one of the at least two controllers.

6. The memory of claim 1, wherein the at least one storage layer comprises two storage layers stacked on the control layer, and wherein each of the two storage layers comprises a fourth quantity of the storage channels.

7. The memory of claim 6, wherein a quantity of the two storage layers is P, wherein the fourth quantity of the storage channels is Q, wherein the first quantity is M, wherein the second quantity is N, wherein P, Q, M, and N are integers greater than 1, wherein P*Q=M, and wherein M>N.

8. The memory of claim 7, wherein Q≤M−N.

9. The memory of claim 8, wherein one or more of the two storage layers are redundant storage layers.

10. The memory of claim 1, wherein each of the storage channels is coupled to a corresponding controller using a vertical interconnection structure.

11. A memory manufacturing method comprising:
forming a control layer comprising controllers and user interfaces, wherein a first quantity of the controllers is greater than a second quantity of the user interfaces, and wherein each of the user interfaces is coupled to at least two controllers; and
stacking at least one storage layer on the control layer, wherein the at least one storage layer comprises storage channels comprising data interface buses that are independent of each other,
coupling the controllers to the data interface buses in a one-to-one correspondence.

12. The memory manufacturing method of claim 11, further comprising coupling each of the user interfaces to a third quantity of the controllers.

13. The memory manufacturing method of claim 12, wherein the first quantity is M, wherein the second quantity is N, wherein the third quantity is M−N+1, wherein both M and N are integers greater than 1, and wherein M>N.

14. The memory manufacturing method of claim 13, wherein an $i^{th}$ user interface in the user interfaces is coupled to $i^{th}$ to $(i+M-N)^{th}$ controllers in the controllers.

15. The memory manufacturing method of claim 11, wherein stacking the at least one storage layer on the control layer comprises stacking two storage layers on the control layer, and wherein each of the two storage layers comprises a fourth quantity of the storage channels.

16. The memory manufacturing method of claim 15, wherein a number of the two storage layers is P, wherein the fourth quantity of the storage channels is Q, wherein the first quantity is M, wherein the second quantity is N, wherein P*Q=M, and wherein M>N.

17. The memory manufacturing method of claim 11, further comprising forming a vertical interconnection structure between a first controller of the controllers and one of the data interface buses that is correspondingly coupled to the first controller.

18. The memory manufacturing method of claim 17, wherein the vertical interconnection structure is a through silicon via (TSV).

19. The memory of claim 10, wherein the vertical interconnection structure is a through silicon via (TSV).

20. An apparatus, comprising:

a processor; and a memory coupled to the processor, comprising:

at least one storage layer comprising storage channels that are independent of each other, wherein the storage channels comprise data interface buses; and a control layer comprising:

controllers coupled to the data interface buses in a one-to-one correspondence; and user interfaces, wherein a first quantity of the controllers is greater than a second quantity of the user interfaces, and wherein each of the user interfaces is coupled to at least two controllers of the controllers, wherein the at least one storage layer is stacked on the control layer.

* * * * *